(12) United States Patent
Wu

(10) Patent No.: US 7,907,457 B2
(45) Date of Patent: Mar. 15, 2011

(54) MEMORY AND VOLTAGE MONITORING DEVICE THEREOF

(75) Inventor: Po-Chang Wu, Taipei County (TW)

(73) Assignee: Winbond Electronics Corp., Hsinchu (TW)

( * ) Notice: Subject to any disclaimer, the term of this patent is extended or adjusted under 35 U.S.C. 154(b) by 452 days.

(21) Appl. No.: 12/047,151

(22) Filed: Mar. 12, 2008

(65) Prior Publication Data

US 2009/0231940 A1  Sep. 17, 2009

(51) Int. Cl.
*G11C 5/14* (2006.01)

(52) U.S. Cl. .............. 365/189.09; 365/185.23; 365/226; 365/201; 365/154

(58) Field of Classification Search ............. 365/189.09, 365/201, 185.23, 185.18, 226, 230.06; 713/340
See application file for complete search history.

(56) References Cited

U.S. PATENT DOCUMENTS

| 5,079,744 | A | * | 1/1992 | Tobita et al. .................. 365/201 |
| 6,002,630 | A | * | 12/1999 | Chuang et al. ................ 365/226 |
| 6,343,036 | B1 | * | 1/2002 | Park et al. ..................... 365/193 |
| 7,359,255 | B2 | * | 4/2008 | Kimura et al. ............ 365/189.09 |
| 7,551,488 | B2 | * | 6/2009 | Tanikawa et al. ........ 365/185.22 |
| 2006/0279442 | A1 | * | 12/2006 | Kimura et al. ................ 341/121 |

* cited by examiner

*Primary Examiner* — Tuan T Nguyen
*Assistant Examiner* — R Lance Reidlinger
(74) *Attorney, Agent, or Firm* — J.C. Patents

(57) ABSTRACT

A memory and a voltage monitoring device thereof are provided. the voltage monitoring device of the memory includes a system voltage detector, a charge pump circuit and a data output unit. The system voltage detector is coupled to the charge pump circuit and the data output unit for detecting a system voltage and thereby producing control signals. The charge pump circuit can produce a word line voltage according to the above-mentioned control signals. The data output unit decides outputting the above-mentioned control signals or the output data of the memory according to a special command, wherein the control signals correspond to the word line voltages. Therefore, the control signals and the word line voltages may be easily monitored.

14 Claims, 5 Drawing Sheets

MEMORY AND VOLTAGE MONITORING DEVICE THEREOF

BACKGROUND OF THE INVENTION

1. Field of the Invention

The present invention generally relates to a memory, and more particularly, to a voltage monitoring technique of a memory.

2. Description of Related Art

An electronic device usually needs a plurality of power voltages with different levels, so that the electronic device is often equipped with a charge pump circuit to use an available power voltage for producing the required power voltages with different levels. In terms of a flash memory, for example, the word line voltage therein is produced by a charge pump circuit.

The word line voltage required by a flash memory for accessing data must remain within an appropriate range. When the word line voltage is excessive, the reliability of the flash memory may adversely affected; when the word line voltage is too low, the access speed of the flash memory may have adversely affected.

Accordingly, a testing engineer must use a testing probe to monitor the word line voltage so as to make sure whether or not the word line voltage is abnormal to render the flash memory unstable or slow access speed. Since the word line voltage is varied with the operation of a flash memory; therefore, to correctly judge whether or not the word line voltage is normal during the operation of the memory, the testing engineer needs to keep the memory running while directly measuring the word line voltage with the testing probe. Therefore, obviously the above-mentioned conventional procedure is inconvenient.

SUMMARY OF THE INVENTION

Accordingly, the present invention is directed to a voltage monitoring device of memory, which is convenient for monitoring the control signal output therefrom. Since the control signal corresponds to the word line voltage of the memory; thus, the word line voltage can be obtained by monitoring the control signal.

The present invention is also directed to a memory, in which the voltage monitoring device provided by the present invention can be directly implanted, so as to effectively monitor the control signal output from the voltage monitoring device and thereby obtain the word line voltage.

The present invention provides a voltage monitoring device of memory. The voltage monitoring device includes a system voltage detector, a charge pump circuit and a data output unit, wherein the system voltage detector is employed for detecting a system voltage and thereby producing a control signal. The charge pump circuit is coupled to the system voltage detector so as to produce a word line voltage according to the above-mentioned control signal. The data output unit is coupled to the system voltage detector so as to decide to output the above-mentioned control signal or the output data of the memory according to a special command.

In an embodiment of the present invention, the above-mentioned voltage monitoring device further includes a switch unit. The switch unit is coupled between the system voltage detector and the data output unit for receiving the control signal and deciding whether or not to outputting the control signal to the data output unit according to the special command. In another embodiment, the switch unit includes a plurality of transistors. The transistor has a first terminal, a second terminal and a gate terminal, wherein the first terminal and the second terminal are respectively coupled to the system voltage detector and the data output unit, while a gate terminal of the above-mentioned transistor is employed for receiving the special command. In yet another embodiment, the control signal is a digital signal.

In an embodiment of the present invention, the voltage monitoring device further includes a special command generator, which includes a decoder and a logic circuit. The decoder is for generating a setting signal. The logic circuit is coupled to the decoder for generating the special command according to the setting signal and a reset signal. In another embodiment, a special signal includes a special address signal and special output data.

In an embodiment of the present invention, the above-mentioned data output unit includes a multiplexer, wherein the multiplexer is employed for deciding to output the control signal or the output data of the memory according to the special command. In another embodiment, the voltage monitoring device further includes an address transition detector (ATD). The ATD is coupled to the system voltage detector for outputting an address transition detection signal (ATDS) to the system voltage detector and the system voltage detector decides whether or not to detect the system voltage according to the ATDS.

The present invention further provides a memory, which includes a charge pump circuit, a system voltage detector and a data output unit. The charge pump circuit is employed for converting a reference voltage into a word line voltage according to a plurality of control signals. The system voltage detector is coupled to the charge pump circuit for producing the above-mentioned control signal according to the system voltage. The data output unit is coupled to the system voltage detector for deciding to output the above-mentioned control signal or output the output data of the memory according to the special command.

The memory and the voltage monitoring device of the present invention adopts a data output unit so that the data output unit is able to decide to output the control signal produced by the system voltage detector or the output data of the memory according to the special command. Thus, it is easier to monitor the control signal output from the system voltage detector.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
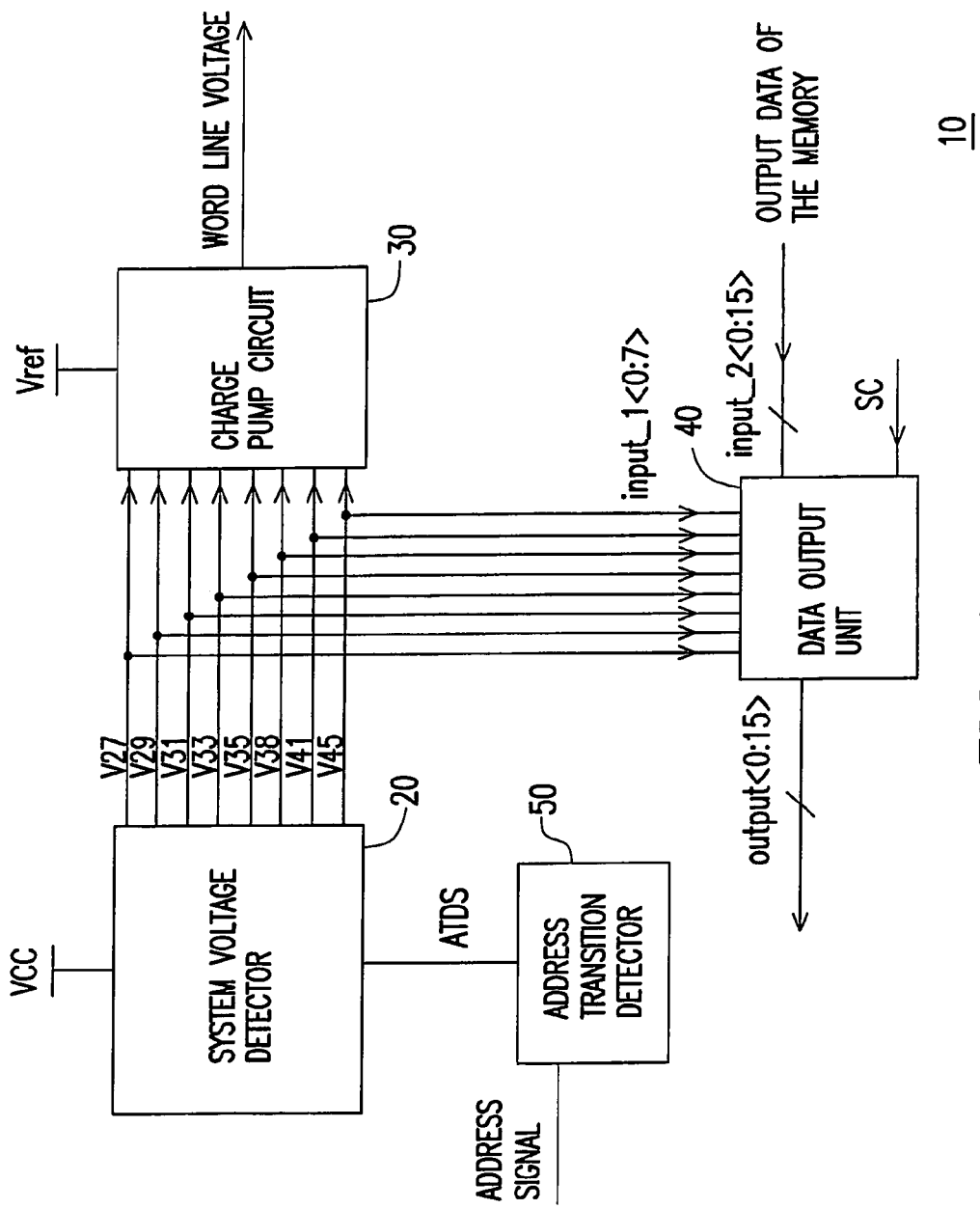
FIG. 1 is an architecture diagram of a voltage monitoring device of memory according to the first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The First Embodiment

FIG. 1 is an architecture diagram of a voltage monitoring device of memory according to the first embodiment of the present invention. Referring to FIG. 1, a voltage monitoring device of memory 10 includes a system voltage detector 20, a charge pump circuit 30, a data output unit 40 and an address transition detector (ATD) 50. The ATD 50 is employed for detecting the address signal of the memory to judge whether or not the address signal is changed and thereby producing an address transition detection signal ATDS. In more detail, when the address signal of the memory is changed, the system voltage detector 20 would produce a pulse signal, i.e., the address transition detection signal ATDS and output the address transition detection signal ATDS to the system voltage detector 20.

The system voltage detector 20 is employed for deciding whether to detect a system voltage VCC according to the address transition detection signal ATDS and thereby producing a plurality of control signals (notated by V27, V29, V31, V33, V35, V38, V41 and V45). In the embodiment, the above-mentioned control signals are digital signals. The control signals V27, V29, V31, V33, V35, V38, V41 and V45 can be produced by a plurality of comparators (not shown).

The system voltage detector 20 can exemplarily respectively compare the system voltage VCC with preset voltages 2.7V, 2.9V, 3.1V, 3.3V, 3.5V, 3.8V, 4.1V, 4.5V, wherein the control signals V27, V29, V31, V33, V35, V38, V41 and V45 are respectively correspond to the preset voltages 2.7V, 2.9V, 3.1V, 3.3V, 3.5V, 3.8V, 4.1V and 4.5V. Specially, when the system voltage VCC is higher than the preset voltage 2.7V, the control signal V27 is a high-level voltage; in contrast, when the system voltage VCC is lower than the preset voltage 2.7V, the control signal V27 is a low-level voltage. Analogically for the rest, the control signals V29, V31, V33, V35, V38, V41 and V45 are produced in the same way. It can be seen that each of the control signals produced by the system voltage detector 20 reflects the value of the system voltage VCC.

The charge pump circuit 30 is coupled to the system voltage detector 20, wherein the charge pump circuit 30 can employ multi stages of boost circuits (not shown), and the boost circuits convert a reference voltage Vref into a word line voltage according to the control signals V27, V29, V31, V33, V35, V38, V41 and V45. In more detail, the charge pump circuit 30 decides whether or not to enable each of the multi stages of boost circuits according to the control signals V27, V29, V31, V33, V35, V38, V41 and V45 provided by the system voltage detector 20. In other words, when the memory needs a higher word line voltage, the charge pump circuit 30 would enable each of the multi stages of boost circuits; when the memory does not need the higher word line voltage, the charge pump circuit 30 would disable a part of the multi stages of boost circuits. The above-mentioned scheme has an advantage that the word line voltage can be controlled within an appropriate range with an additional electricity-saving effect.

In the embodiment, the data output unit 40 comprises first input terminals input_1<0:7>, second input terminals input_2<0:15> and output terminals output<0:15>, which respectively correspond to 8 circuits, 16 circuits and 16 circuits. The first input terminals input_1<0:7> of the data output unit 40 respectively receive the control signals V27, V29, V31, V33, V35, V38, V41 and V45, and the second input terminals input_2<0:15> of the data output unit 40 respectively receive the output data of the memory.

Note that the data output unit 40 is able to decide the wirings of the output terminals output<0:15>, the first input terminals input_1<0:7> and the second input terminals input_2<0:15> according to a special command SC. When the special command SC is a low-level voltage, it indicates the memory is in normal mode, then, the output terminals output<0:15> of the data output unit 40 are respectively coupled to the second input terminals input_2<0:15> thereof; when the special command SC is a high-level voltage, it indicates the memory is in testing mode, then, the output terminals output<0:7> of the data output unit 40 are respectively coupled to the first input terminals input_1<0:7> thereof and the output terminals output<8:15> are respectively coupled to the second input terminals input_2<8:15> thereof.

It can be seen from the above description that when the memory is in testing mode, the output terminals output<0:15> of the data output unit 40 can simultaneously output the control signals V27, V29, V31, V33, V35, V38, V41 and V45 and the partial output data of the memory. Anyone skilled in the art can couple the output terminals output<0:15> to a display (not shown), so that it can monitor not only the variations of the control signals V27, V29, V31, V33, V35, V38, V41 and V45, but also the operation of the memory and the variation of the output data of the memory.

Since the control signals V27, V29, V31, V33, V35, V38, V41 and V45 are obtained depending on the system voltage VCC, and the value of the word line voltage depends on the control signals V27, V29, V31, V33, V35, V38, V41 and V45, therefore, if the control signals V27, V29, V31, V33, V35, V38, V41 and V45 are abnormal, it indicates the system voltage VCC or the word line voltage is abnormal too. Accordingly, for the memory in testing mode, the control signals V27, V29, V31, V33, V35, V38, V41 and V45 can be easily monitored by using the data output unit 40, which further is used to detect whether or not the word line voltage and the system voltage VCC are normal.

Compared to the prior art, the embodiment provides more convenience. In addition, the embodiment can further simultaneously monitor the variations of each control signal and the output data of the memory, which largely promote the efficiency and convenience of the testing. Moreover, in the prior art, to measure each of the control signals provided by the system voltage detector 20, the same quantity of the testing probes must be employed, while in the embodiment, the same objective can be done by directly monitoring each of the control signals at the output terminals output<0:7> of the data output unit 40 so as to significantly improve the testing convenience. An implementation of the data output unit 40 is described in the following for illustrating the present invention.

Figure 2:
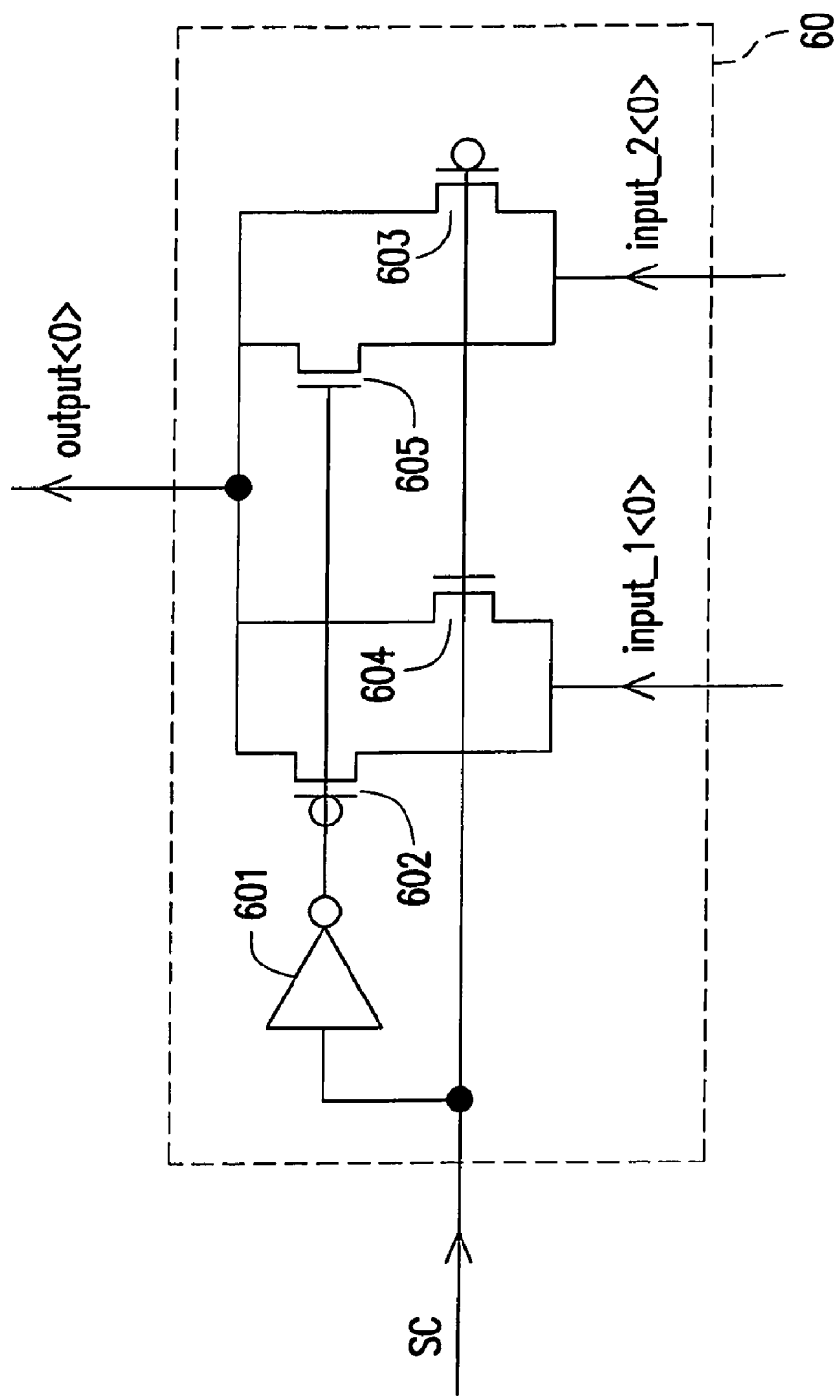
FIG. 2 is an architecture diagram of a data output unit according to the first embodiment of the present invention.

FIG. 2 is an architecture diagram of a data output unit according to the first embodiment of the present invention. Referring to FIGS. 1 and 2, the data output unit 40 in the embodiment includes eight multiplexers 60, which are respectively coupled to the first input terminals input_1<0:7>, the second input terminals input_2<0:7> and the output terminals output<0:7>. In FIG. 2, it is exemplarily shown for depiction purpose that a single multiplexer 60 is coupled to a first input terminal input_1<0>, a second input terminal input_2<0> and an output terminal output<0>. The multiplexer 60 includes a NOT gate 601, two P-channel MOS-transistors 602 and 603, and two N-channel MOS-transistors 604 and 605. When the special command SC takes a high-level voltage, the transistors 604 and 603 respectively are turned on and turned off. Besides, the NOT gate 601 would transit the high-level of the special command SC into a low-level voltage, so that the transistors 602 and 605 respectively are turned on and turned off. As a result, when the special command SC takes the high-level voltage, the multiplexer 60 outputs the signal of the first input terminal input_1<0>.

Further, when the special command SC takes a low-level voltage, the transistors 604 and 603 are respectively in off state and on state. Besides, the NOT gate 601 would transit the low-level of the special command SC into a high-level voltage to respectively turn the transistors 602 and 605 off and on. As a result, when the special command SC takes the low-level voltage, the multiplexer 60 outputs the signal of the second input terminal input_2<0>. Analogically for the rest seven multiplexers 60, which are respectively coupled to the first input terminals input_1<1:7>, the second input terminals input_2<1:7> and the output terminals output<1:7>. In this way, the data output unit 40 is able to decide to output the control signals or the output data of the memory according to the special command SC.

Figure 3:
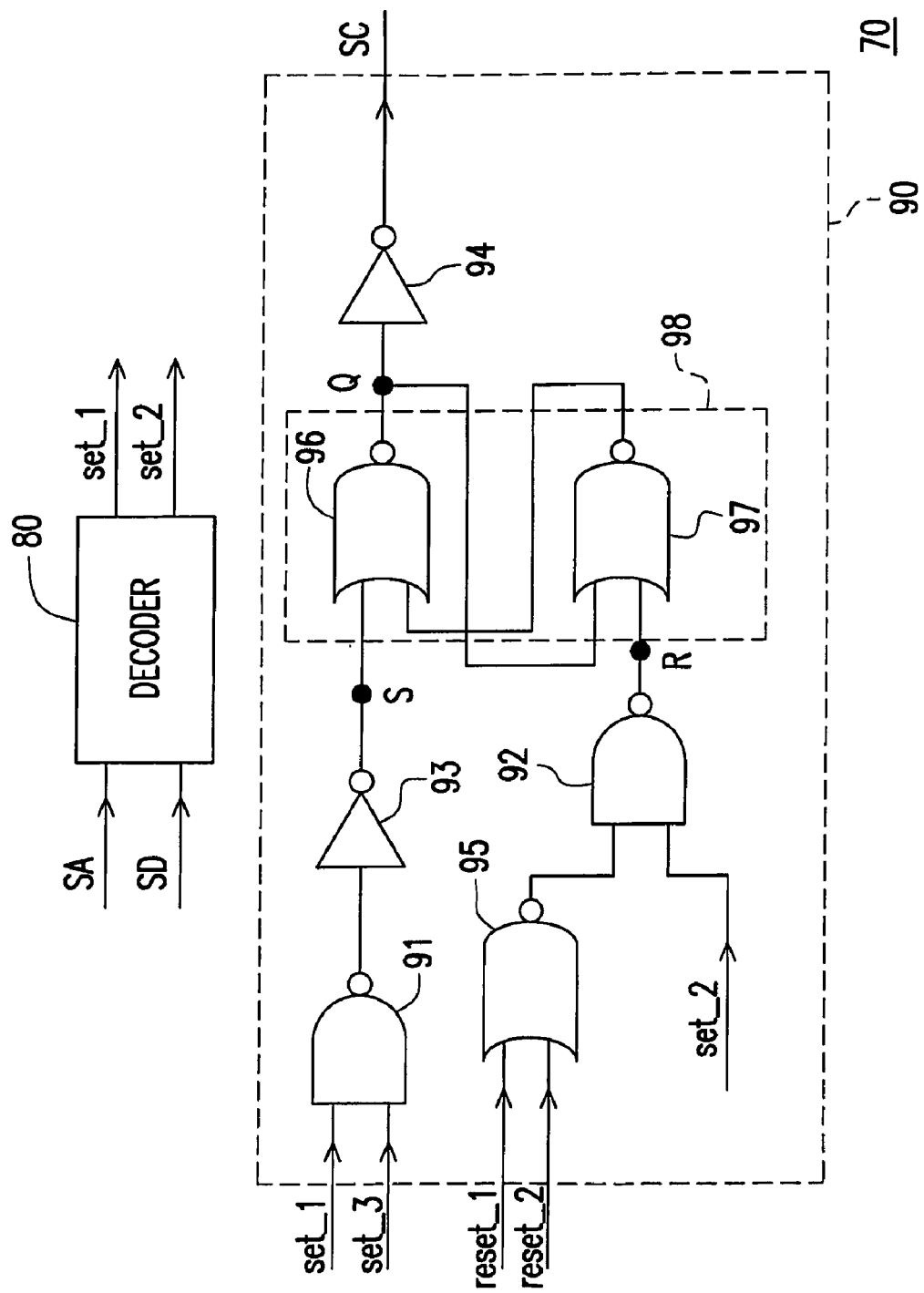
FIG. 3 is an architecture diagram of a special command generator according to the first embodiment of the present invention.

FIG. 3 is an architecture diagram of a special command generator according to the first embodiment of the present invention. Referring to FIG. 3, the voltage monitoring device of memory 10 employs a special command generator 70. In the embodiment, the special command generator 70 includes a decoder 80 and a logic circuit 90. The logic circuit includes two NAND gates 91 and 92, two NOT gates 93 and 94 and three NOR gates 95, 96 and 97, and the NOR gates 96 and 97 form an S-R latch circuit 98, wherein 'S' and 'R' represent 'set' and 'reset'. The S-R latch circuit is a logic circuit with a memory-like function and the output thereof depends on not only the input thereof, but also the previous status of the circuit. The logic circuit 90 decides the voltage level of the special command SC according to the voltage level at the terminal Q of the S-R latch circuit 98, and the voltage level of the terminal Q is opposite to the voltage level of the special command SC. The following table lists the true values of the S-R latch circuit 98 for reference.

TABLE 1

Truth Table of the S-R Latch Circuit.

| Q | S | R |
|---|---|---|
| 0 | 1 | 0 |
| 1 | 0 | 1 |
| 0 | 1 | 1 |
| $Q_{-1}$ | 0 | 0 |

The logic circuit 90 decides the voltage level of the terminal S according to two setting signals set_1 and set_3. Specially, only when the setting signals set_1 and set_3 simultaneously take a high-level voltage, the terminal S possess the high-level voltage. On the other hand, the logic circuit 90 can decide the voltage level of the terminal R according to the setting signals set_2 and another two resetting signals reset_1 and reset_2, where when the setting signal set_2, the resetting signal reset_1 or reset_2 take the high-level voltage, the terminal R can have the high-level voltage.

Assuming the initial status of the memory is in normal mode (corresponding to the terminal Q with the high-level voltage), in order to make the memory enter the testing mode, the setting signals set_1 and set_3 must be high-level voltage and the setting signal set_2 must be maintained at the low-level voltage. In order to make the memory return back the normal mode, the resetting signals reset_1 or reset_2 must be low-level voltage, wherein the low-level voltage of the resetting signal reset_1 can be triggered, for example, by the system power of the memory, while the low-level voltage of the setting signals set_2 can be triggered by, for example, the system chip pins (not shown) of the memory.

Continuing to FIG. 3, the decoder 80 can generate the setting signals set_1 and set_2 according to a special address signal SA and special output data SD. Specially, when the address of the special address signal SA in the embodiment is, for example, 0000-0000-0111-0111-0111 and the special output data SD is, for example, 0000-0011-0000-1000, the decoder 80 would output the setting signal set_1 in high-level voltage and the setting signal set_3 in low-level voltage. After that, with the setting signal set_2 in high-level voltage, the memory is able to enter the testing mode. It can be seen that the above-mentioned sophisticate setting way can ensure the memory entering the testing mode without a fault due to man-made wrong setting.

Note that although the above-mentioned embodiment has provided a feasible implementation of the memory and the voltage monitoring device thereof, but it can be understood that different manufacturers may design a memory and the voltage monitoring device thereof to practice the teachings of the present invention, which shall also be construed to be within the scope of the present invention so long as the voltage monitoring device of memory is able to decide the control signals or the output data of the memory output from the voltage monitoring device of memory according to the special command. Hereinafter, another embodiment of the present invention is depicted in detail.

The Second Embodiment

Figure 4:
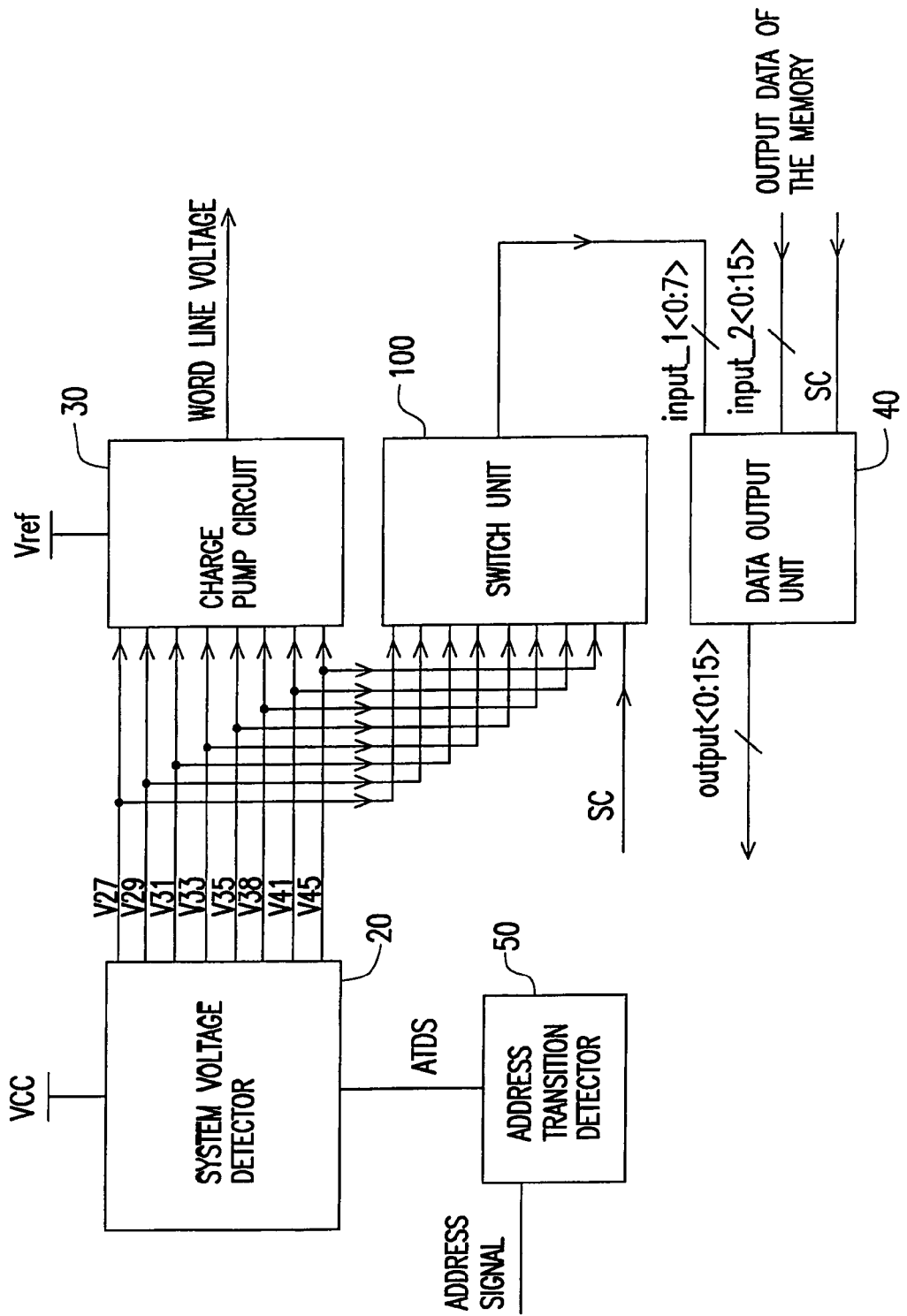
FIG. 4 is an architecture diagram of a voltage monitoring device of memory according to the second embodiment of the present invention.

FIG. 4 is an architecture diagram of a voltage monitoring device of memory according to the second embodiment of the present invention. Referring to FIGS. 1 and 4, which is similar to the above-mentioned embodiment except for a switch unit 100, which is employed to decide whether or not to send the control signals V27, V29, V31, V33, V35, V38, V41 and V45 respectively to the first input terminals input_1<0:7> of the data output unit 40 according to the special command SC. Same components shown in FIG. 4 as those in FIG. 1 are omitted to describe for simplicity.

Figure 5:
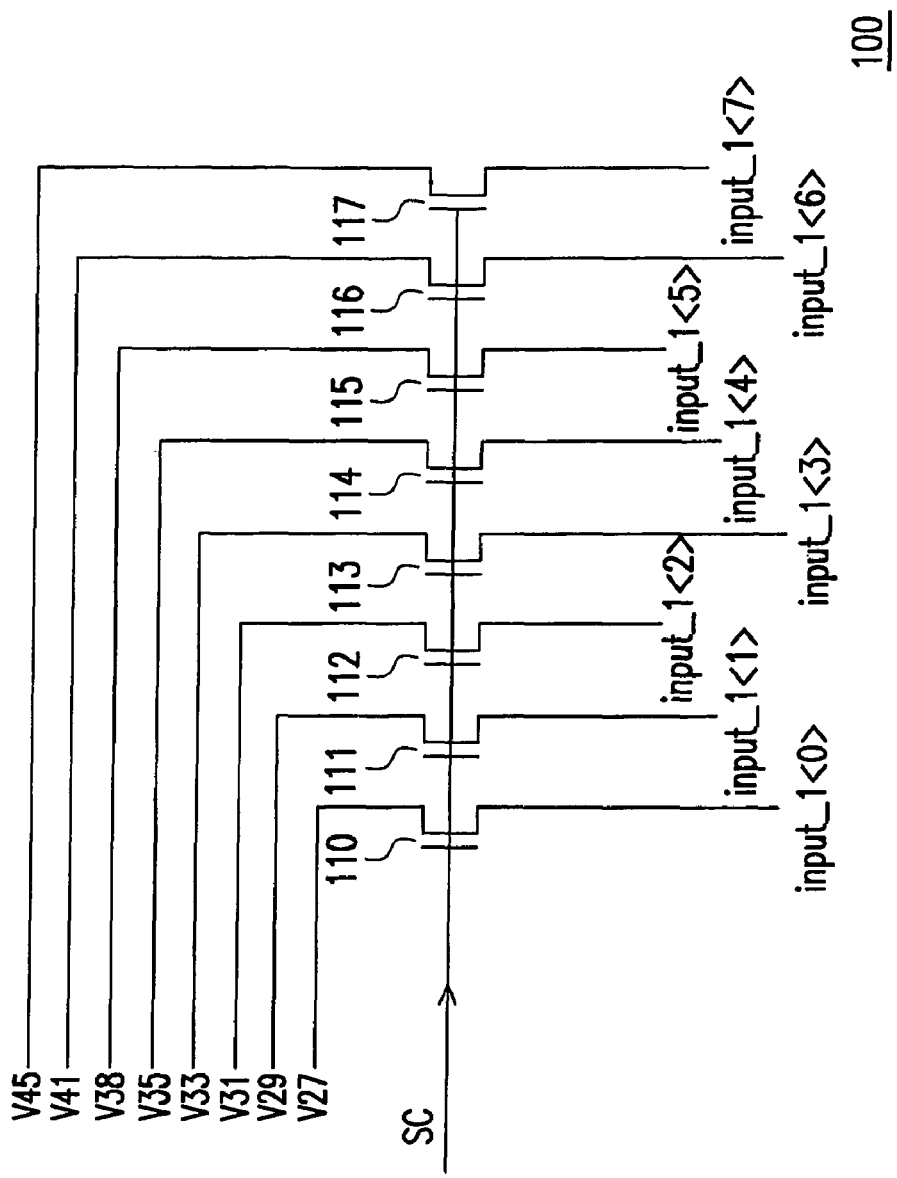
FIG. 5 is an architecture diagram of a switch unit according to the second embodiment of the present invention.

FIG. 5 is an architecture diagram of a switch unit according to the second embodiment of the present invention. Referring to FIGS. 4 and 5, the switch unit 100 includes N-channel MOS-transistors 110-117. The first terminals of the transistors 110-117 respectively receive the control signals V27, V29, V31, V33, V35, V38, V41 and V45, and the second terminals thereof are respectively coupled to the first input terminals input_1<0:7> of the data output unit 40. When the special command SC takes the high-level voltage, the transistors 110-117 are turned on, and the control signals V27, V29, V31, V33, V35, V38, V41 and V45 are respectively sent to the first input terminals input_1<0:7>. The advantage of the scheme is that it allows other modules to use the first input terminals input_1<0:7> of the data output unit 40, which avoids mutual signal interference.

Referring to FIG. 1 again, although the control signals produced by the system voltage detector 20 in the first embodiment are exemplified using eight signals, but the present invention is not limited thereto. In fact, as indicated by other embodiments of the present invention, any number of control signals may be used to accordingly adjust the circuitry of the data output unit 40.

In summary, the memory and the voltage monitoring device thereof use the special command to control the data output unit for outputting the control signals provided by the system voltage detector or the output data of the memory.

Therefore, it is easy to monitor the above-mentioned control signals and thereby infer the situation of the system voltage or the word line voltage. In addition, the embodiments of the present invention have at least following advantages.

1. Resolveing the inconvenience of the prior art where a testing probe is required to directly measure the word line voltage or the control signals.

2. By using the special command generator, a fault of mode-switching for the memory to enter the testing mode due to accidental contact may be avoided, and the memory can return back to the normal mode.

3. By disposing an additional switch unit between the system voltage detector and the data output unit, other modules may be used to serve as the first input terminals of the data output unit so as to avoid mutual signal interference.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage monitoring device of memory, comprising:
   a system voltage detector, for detecting a system voltage and producing a plurality of control signals;
   a charge pump circuit, coupled to the system voltage detector for producing a word line voltage according to the control signals;
   a data output unit, coupled to the system voltage detector for deciding to output the control signals or an output data of the memory according to a special command; and
   an address transition detector, coupled to the system voltage detector for outputting an address transition detection signal to the system voltage detector, wherein the system voltage detector decides whether or not to detect the system voltage according to the address transition detection signal.

2. The voltage monitoring device of memory according to claim 1, further comprising:
   a switch unit, coupled between the system voltage detector and the data output unit for receiving the control signals and deciding whether or not to output the control signals to the data output unit according to the special command.

3. The voltage monitoring device of memory according to claim 2, wherein the switch unit comprises:
   a plurality of transistors, respectively having a first terminal, a second terminal and a gate terminal, wherein the first terminals and the second terminals are respectively coupled to the system voltage detector and the data output unit, and the gate terminals of the transistors receive the special command.

4. The voltage monitoring device of memory according to claim 1, further comprising:
   a special command generator, comprising:
      a decoder, for generating a setting signal according to a special signal; and
      a logic circuit, coupled to the decoder for generating the special command according to the setting signal and a resetting signal.

5. The voltage monitoring device of memory according to claim 4, wherein the special signal comprises a special address signal or a special output data.

6. The voltage monitoring device of memory according to claim 1, wherein the data output unit comprises a multiplexer for deciding to output the control signals or the output data of the memory according to the special command.

7. The voltage monitoring device of memory according to claim 1, wherein the control signals are digital signals.

8. A memory, comprising:
   a charge pump circuit, for converting a reference voltage into a word line voltage according to a plurality of control signals.
   a system voltage detector, coupled to the charge pump circuit for producing the control signals according to a system voltage;
   a data output unit, coupled to the system voltage detector for deciding to output the control signals or an output data of the memory according to a special command; and
   an address transition detector, coupled to the system voltage detector for outputting an address transition detection signal to the system voltage detector, wherein the system voltage detector decides whether or not to detect the system voltage according to the address transition detection signal.

9. The memory according to claim 8, further comprising:
   a switch unit, coupled between the system voltage detector and the data output unit for receiving the control signals and deciding whether or not to output the control signals to the data output unit according to the special command.

10. The memory according to claim 9, wherein the switch unit comprises:
    a plurality of transistors, respectively having a first terminal, a second terminal and a gate terminal, wherein the first terminals and the second terminals are respectively coupled to the system voltage detector and the data output unit, and the gate terminals of the transistors receive the special command.

11. The memory according to claim 8, further comprising:
    a special command generator, comprising:
       a decoder, for generating a setting signal according to a special signal; and
       a logic circuit, coupled to the decoder for generating the special command according to the setting signal and a resetting signal.

12. The memory according to claim 11, wherein the special signal comprises a special address signal or a special output data.

13. The memory according to claim 8, wherein the data output unit comprises a multiplexer for deciding to output the control signals or the output data of the memory according to the special command.

14. The memory according to claim 8, wherein the control signals are digital signals.

* * * * *